US012028985B2

(12) United States Patent
Lee et al.

(10) Patent No.: US 12,028,985 B2
(45) Date of Patent: Jul. 2, 2024

(54) ELECTRICAL DEVICE HAVING HEAT DISSIPATION STRUCTURE USING FILLER AND MANUFACTURING METHOD OF THE SAME

(71) Applicant: SOLUM CO., LTD., Gyeonggi-do (KR)

(72) Inventors: Jun Kyu Lee, Gyeonggi-do (KR); Jeong Man Han, Gyeonggi-do (KR); Su Young Kim, Gyeonggi-do (KR); Yong Woo Kang, Gyeonggi-do (KR); Sang Keun Ji, Gyeonggi-do (KR); Dong Kyun Ryu, Seoul (KR)

(73) Assignee: SOLUM CO., LTD., Gyeonggi-Do (KR)

( * ) Notice: Subject to any disclaimer, the term of this patent is extended or adjusted under 35 U.S.C. 154(b) by 134 days.

(21) Appl. No.: 17/398,277

(22) Filed: Aug. 10, 2021

(65) Prior Publication Data

US 2022/0183161 A1 Jun. 9, 2022

(30) Foreign Application Priority Data

Dec. 9, 2020 (KR) .......................... 10-2020-0171349

(51) Int. Cl.
*H05K 3/28* (2006.01)
*H05K 1/02* (2006.01)
*H05K 13/00* (2006.01)

(52) U.S. Cl.
CPC ........... *H05K 3/284* (2013.01); *H05K 1/0203* (2013.01); *H05K 13/00* (2013.01); *H05K 2201/0212* (2013.01); *H05K 2203/1316* (2013.01)

(58) Field of Classification Search
CPC ................. H05K 3/284; H05K 1/0203; H05K 2203/1316; H05K 7/20463; H05K 7/205;
(Continued)

(56) References Cited

U.S. PATENT DOCUMENTS 3,699,394 A * 10/1972 Schuler ................ H05K 5/064
174/548
5,554,821 A * 9/1996 Patterson ............... H05K 3/284
174/541
(Continued)

FOREIGN PATENT DOCUMENTS

CN 102369792 A * 3/2012 ............. H05K 5/064
DE 102011075308 A1 * 11/2012 ............. H05K 3/284
(Continued)

OTHER PUBLICATIONS

Office Action issued in KR 10-2020-0171349 dated May 9, 2021.
(Continued)

*Primary Examiner* — Jeffrey T Carley
(74) *Attorney, Agent, or Firm* — Ladas & Parry, LLP

(57) ABSTRACT

The present invention relates to an electrical device including a printed circuit board (PCB) module accommodated in a case, and more particularly, to an electrical device having a heat dissipation structure using a filler that reduces heat generation outside a case while increasing a heat dissipation efficiency of a PCB module by using the filler filled in the case, and a manufacturing method of the same.

20 Claims, 17 Drawing Sheets

(58) Field of Classification Search
CPC .. H05K 7/20518; H05K 5/0069; H05K 5/064; H02J 7/00
See application file for complete search history.

(56) References Cited

U.S. PATENT DOCUMENTS

| | | | | |
|---|---|---|---|---|
| 5,617,297 | A * | 4/1997 | Lo | G06K 19/07745 |
| | | | | 361/752 |
| 5,887,435 | A * | 3/1999 | Morton | H05K 7/20709 |
| | | | | 361/713 |
| 6,704,202 | B1 * | 3/2004 | Hamaoka | H05K 7/20463 |
| | | | | 62/505 |
| 7,751,194 | B2 * | 7/2010 | Sakamoto | H05K 7/20009 |
| | | | | 174/547 |
| 8,107,208 | B2 * | 1/2012 | Hotchkiss | H02H 9/044 |
| | | | | 29/841 |
| 2006/0044762 | A1 * | 3/2006 | Kikuchi | H05K 7/209 |
| | | | | 257/E23.105 |
| 2009/0086454 | A1 * | 4/2009 | Sakamoto | H05K 5/065 |
| | | | | 361/796 |
| 2011/0183472 | A1 * | 7/2011 | Lin | H01L 21/486 |
| | | | | 438/118 |
| 2017/0090532 | A1 | 3/2017 | Koukami et al. | |
| 2022/0115881 | A1 * | 4/2022 | Yamanaka | H02J 7/0042 |

FOREIGN PATENT DOCUMENTS

| | | | | |
|---|---|---|---|---|
| DE | 202014104730 U1 * | 2/2016 | | H05K 5/064 |
| JP | 2003-298009 | 10/2003 | | |
| JP | 2005129820 A | 5/2005 | | |
| JP | 2005142256 A * | 6/2005 | | |
| JP | 2005294703 A | 10/2005 | | |
| JP | 2006190726 A * | 7/2006 | | B29C 45/14377 |
| KR | 100677620 B | 2/2007 | | |
| WO | 2015/137257 | 4/2017 | | |

OTHER PUBLICATIONS

Office Action dated Jan. 8, 2024 for Korean Patent Application No. 10-2021-0108134 and its English translation provided by Applicant's foreign counsel.

* cited by examiner

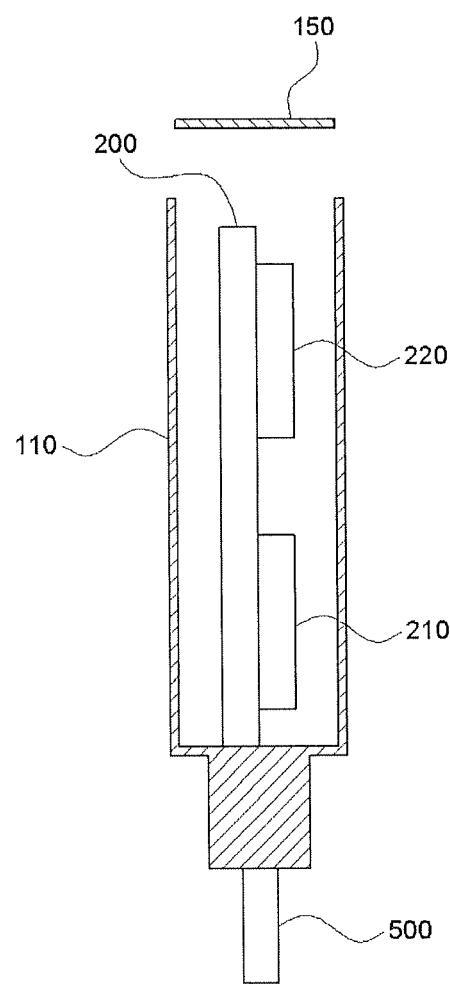

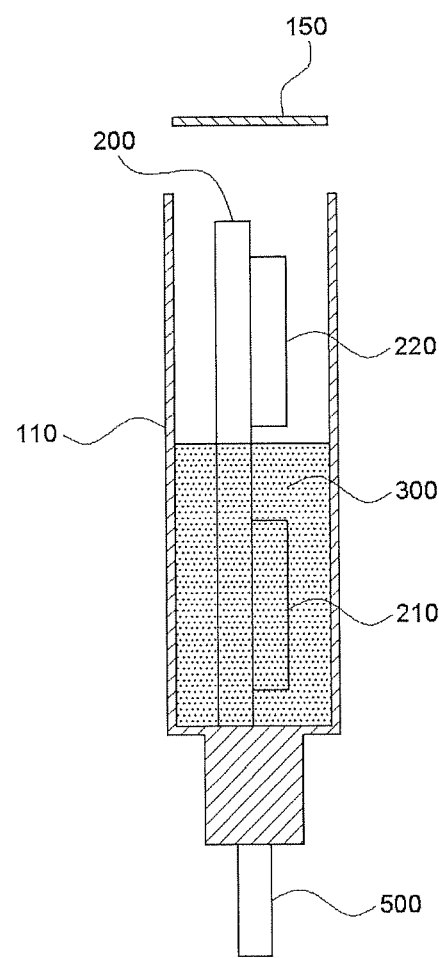

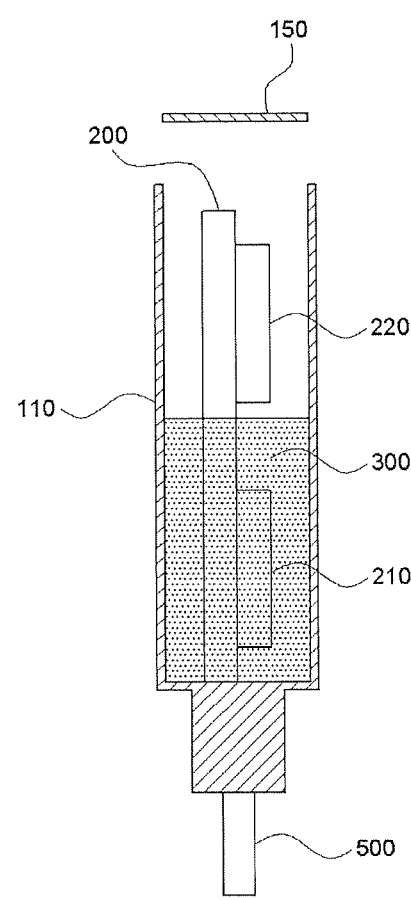

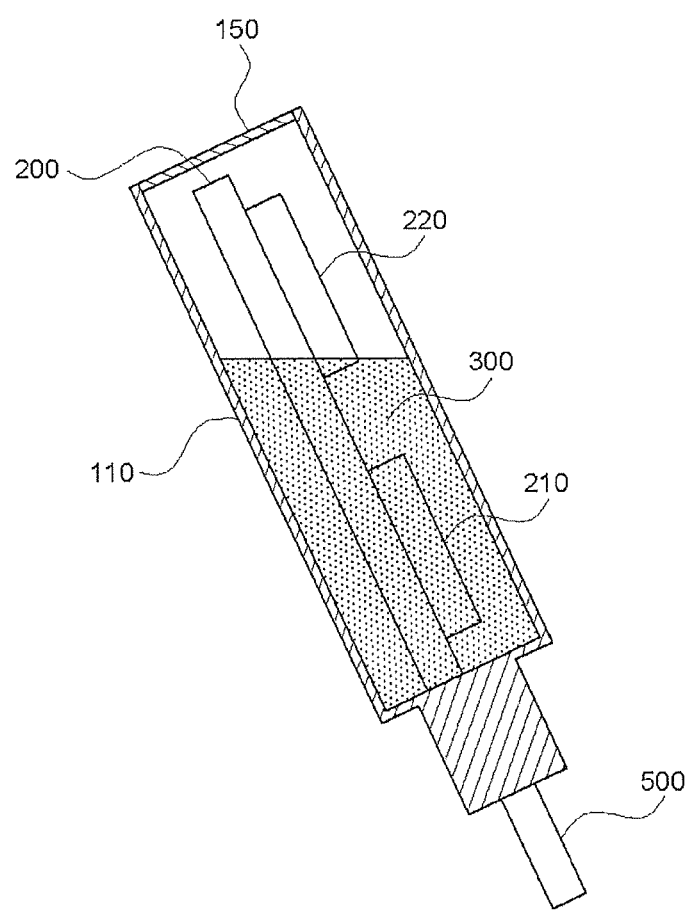

ELECTRICAL DEVICE HAVING HEAT DISSIPATION STRUCTURE USING FILLER AND MANUFACTURING METHOD OF THE SAME

CROSS-REFERENCE TO RELATED APPLICATIONS

This application claims priority under 35 U.S.C. § 119 to Korean Patent Application No. 10-2020-0171349, filed on Dec. 9, 2020, in the Korean Intellectual Property Office, the disclosure of which is incorporated herein by reference in its entirety.

TECHNICAL FIELD

The following disclosure relates to an electrical device including a printed circuit board (PCB) module accommodated in a case, and more particularly, to an electrical device having a heat dissipation structure using a filler that reduces heat generation outside a case while increasing a heat dissipation efficiency of a PCB module by using the filler filled in the case, and a manufacturing method of the same.

BACKGROUND

Electrical devices are trending toward miniaturization, weight reduction, and large capacity day by day. In particular, chargers for charging mobile devices have high demands for miniaturization, weight reduction, and large capacity. Hereinafter, the description is made based on the charger as a representative of the electrical devices. However, the rights of the present invention are not limited to the charger.

In recent years, due to large capacity of the mobile devices and an increase in power consumption, it is required to increase a capacity of a battery, which is a power source of the mobile device, and to shorten a charging time. When an output capacity of the charger is increased to satisfy such requirement, the amount of heat generated increases. General electrical devices use a case as a heat sink to dissipate internal heat to the outside, thereby lowering a temperature of internal components. In the case of the electrical devices such as the chargers, where a user may be in contact with the case, there is a limitation in using the case as the heat sink because it is required to lower a temperature of a surface of the case that the user is in contact with and keep it below a certain level (for example, 60 degrees Celsius) in order to prevent low-temperature burns of the user.

Conventional chargers have a sufficiently large size to dissipate heat by using an internal natural convection phenomenon. However, such a conventional charger has a problem in that the internal components of the charger are continuously exposed to an over-temperature, and the components that are continuously exposed to the over-temperature for a long time may shorten a lifespan, may cause malfunction, or may be damaged. Furthermore, in the case in which the capacity of the charger is further increased and the size of the charger is reduced, since the amount of heat generated by the internal components increases, an interval between the internal components and a space between the internal components and the case are reduced, a problem that the internal temperature is excessively increased becomes more serious, there is a problem that it is difficult to achieve an increase in capacity and miniaturization of the charger.

In addition, in a case of dissipating heat by filling the case with a resin material with high thermal conductivity in the miniaturized charger, since the space between the components and the PCB and the case is narrow, it is not easy to insert the resin material into an injection nozzle. Therefore, there is a problem in that it is difficult to evenly inject the resin material into the case, and heat dissipation performance is deteriorated due to the air pockets because air pockets are easily generated between the component and the PCB and the fluid.

In addition, in the case of assembling the components and the PCB by first injecting a resin material with high thermal conductivity into the case where the components and the PCB are not assembled, and then inserting the components and the PCB into the case in order to solve the above-mentioned problem, since the components and the PCB are assembled in a state in which contact portions between electrical terminals provided inside the case and the components and the PCB are immersed in the resin material or has the resin material embedded thereon, there is a problem in that contact failure may occur due to a resin material at the contact portions between the components and the PCB and the terminals.

In addition, when the resin material having high thermal conductivity is filled inside the charger, it is advantageous in dispersing heat, but there is a problem that the weight of the charger increases.

In addition, when the case of the charger forms one internal space, there is a problem that the weight reduction of the charger is inhibited by being filled with the resin material even in a region where the filling of the thermally conductive resin material is not relatively required, such as a region in which the components and the PCB are not disposed inside the charger.

In addition, in order to satisfy the criterion that the charger should not have trouble when it drops from a predetermined height, the charger should be light and should be able to protect the internal components and the PCB even from a drop impact. However, there is a problem in that it is difficult to reduce the size and weight of the charger because a support member for fixing and protecting the components and the PCB needs to be additionally provided.

In addition, there is a problem in that it is difficult to secure a separation distance between the components for securing electrical insulation between the components provided therein as the size of the charger decreases.

SUMMARY

An embodiment of the present invention is directed to providing an electrical device having high reliability and high output density, more particularly, to providing an electrical device capable of having large capacity and small size and weight and preventing low-temperature burns of a user by limiting heat dissipation through a case while preventing over-heating of components by dispersing internal heat generation without adopting heat dissipation means such as a cooling fin, a cooling fan, or a water cooling channel.

An embodiment of the present invention is directed to providing an electrical device that improves heat dissipation efficiency and disperses heat generated from components to prevent local heat concentration at characteristic locations such as high-heat generation components, shortening the life of the components or damage to the components due to over-heating by forming a thermally conductive insulating filler in a region (a lower region of a case) where the components with the high amount of heat generation on a PCB module installed in the case are disposed, minimizes a weight increase caused by a filler to reduce an overall weight, and suppresses heat transfer to a region (an upper region of the case) where the user grips the electrical device while dispersing the heat generated from the components to prevent low-temperature burns of the user, compared to a case where an entire electrical device is filled with a filler by disposing components with low heat generation in a region gripped by the user (a region in an upper direction of the case) and not forming the filler or forming the filler to the minimum, and does not require a separate heat shielding means for user burn protection in a gripping region of the user.

An embodiment of the present invention is directed to providing to a high output density electrical device with a minimized size and weight that does not require to adopt a separate fixing member by a cured filler supporting a PCB module, and may reduce a separation distance for securing insulation between components by adopting a filler with higher insulation property than air.

An embodiment of the present invention is directed to providing a high reliability electrical device that prevents thermal conductivity from being deteriorated by preventing delamination or voids between the components and the filler even when the components expand or contract by a resin material forming the filler containing an adhesive component.

An embodiment of the present invention is directed to providing an electrical device that forms a heat transfer path to increase a heat dissipation area and reduce a weight by providing an additional thermal conductor or thermally conductive coating between the components in a region (an upper region of the case) where the filler is not filled and the filled filler (a lower region of the case).

For reference, the objects of the present invention are not limited to the above-mentioned objects, and other objects not mentioned will be clearly understood by those skilled in the art from the following description.

In one general aspect, an electrical device includes: a case including a lower portion and a side wall, and having a space formed therein; a printed circuit board (PCB) module accommodated in an internal space of the case and including a plurality of components and a PCB on which the plurality of components are mounted; and a filler existing in the internal space of the case and made of a resin material, wherein the filler is in contact with the PCB module, is in contact with the lower portion of the case, or is contact with a portion of the lower portion and the side wall of the case.

The PCB module may include a first region including a first component group and a second region including a second component group, an amount of heat generation of the first component group may be greater than an amount of heat generation of the second component group, and a region in which the filler is in contact with the first region may be greater than a region in which the filler is in contact with the second region.

The filler may be non-contact with the second region and may be in contact with at least a portion of the first region.

The filler may be in contact with a region of 10% or more to 100% or less of the first region.

The filler may be in contact with a region of 20% or more to 90% or less of the first region.

The filler may have a contact area with the case of 30% or more to 90% or less of a total area of the case.

The filler may include an adhesive component, and may be in contact with both surfaces of the first region of the PCB.

The PCB may include at least one through hole in the first region so that the resin material forming the filler flows between one surface and the other surface of the PCB in a fluid state before being cured.

The PCB module may be accommodated in the case in a length direction (Z axis direction) of the PCB module, the first region may be formed to be closer to a lower side (a negative direction of a Z axis) of the PCB module compared to the second region, and the through hole may be formed to be closer to the lower side (the negative direction of the Z axis) of the PCB module compared to the first component group included in the first region.

A maximum allowable temperature of the second component group may be higher than the maximum allowable temperature of the first component group.

The first component group may include at least one of a transformer and a semiconductor switch, and the second component group may include a capacitor.

A heat transfer reinforcing member may be provided between at least a portion of the first component group that is not directly in contact with the filler and the filler.

The heat transfer reinforcing member may be a metal material or a thermal pad.

The filler may have a thermal conductivity of 0.6 W/mk or more.

The filler may have an insulation breakdown voltage of 10 kV/mm or more.

The filler may have an adhesion of 50 gf/10 mm or more to 1,000 gf/10 mm or less.

The filler may have a specific gravity of 3 or less.

The filler may have a hardness of 80 or less in Shore A type or Shore D type.

The filler may have a remaining amount of 800° C. of 70% by weight or more in a thermo gravimetric analysis (TGA).

The filler may include an acrylic resin, an epoxy resin, a urethane resin, an olefin resin, an EVA resin, or a silicone resin.

The filler may include ceramic particles or carbon-based fillers.

The filler may include a thixotropy imparting agent, a diluent, a dispersant, a surface treatment agent, a flame retardant, or a coupling agent.

The filler may further include a coating region coated with the resin material with a predetermined thickness on the case or the PCB module.

The coating region may be formed at an upper side than a filling height of the filler.

A weight of the heaviest component in the first component group may be heavier than a weight of the heaviest component in the second component.

In another general aspect, a manufacturing method of the electrical device includes: (a) forming a filler by injecting a resin material into an internal accommodation space of a case; (b) assembling a PCB module by accommodating the PCB module in the accommodation space; and (c) recovering a portion of the injected resin material so that a coating region is formed at an upper side (a positive direction of a Z axis) than a filling height of the filler.

In another general aspect, a manufacturing method of the electrical device includes: (a) assembling a PCB module by accommodating the PCB module in an internal accommodation space of a case; (b) forming a filler by injecting a resin material into the accommodation space; and (c) recovering a portion of the injected resin material so that a coating region is formed at an upper side (a positive direction of a Z axis) than a filling height of the filler.

In another general aspect, a manufacturing method of the electrical device includes: (a) forming a filler by injecting a resin material into an internal accommodation space of a case; (b) assembling a PCB module by accommodating the PCB module in the accommodation space; and (c) forming a coating region by tilting the case at a predetermined angle in at least one direction so that the resin material is coated with a predetermined thickness at an upper side (a positive direction of a Z axis) than a filling height of the filler.

In another general aspect, a manufacturing method of the electrical device includes: (a) assembling a PCB module by accommodating the PCB module in an internal accommodation space of a case; (b) forming a filler by injecting a resin material into the accommodation space; and (c) forming a coating region by tilting the case at a predetermined angle in at least one direction so that the resin material is coated with a predetermined thickness at an upper side (a positive direction of a Z axis) than a filling height of the filler.

The PCB module may include a first region including a first component group and located at a lower side, and a second region including a second component group and located at an upper side, and the filling height of the filler may be located at a lower side than the second region.

BRIEF DESCRIPTION OF THE DRAWINGS

FIG. 7A to 7C is a schematic cross-sectional view of a manufacturing method of an electrical device according to the first embodiment of the present invention.

FIG. 8A to 8C is a schematic cross-sectional view of a manufacturing method of an electrical device according to the second embodiment of the present invention.

FIGS. 9A to 9E are schematic cross-sectional views of a manufacturing method of an electrical device according to the third embodiment of the present invention.

DETAILED DESCRIPTION OF EMBODIMENTS

Hereinafter, an embodiment of the present invention will be described in detail with reference to the accompanying drawings.

First Embodiment

Figure 1:
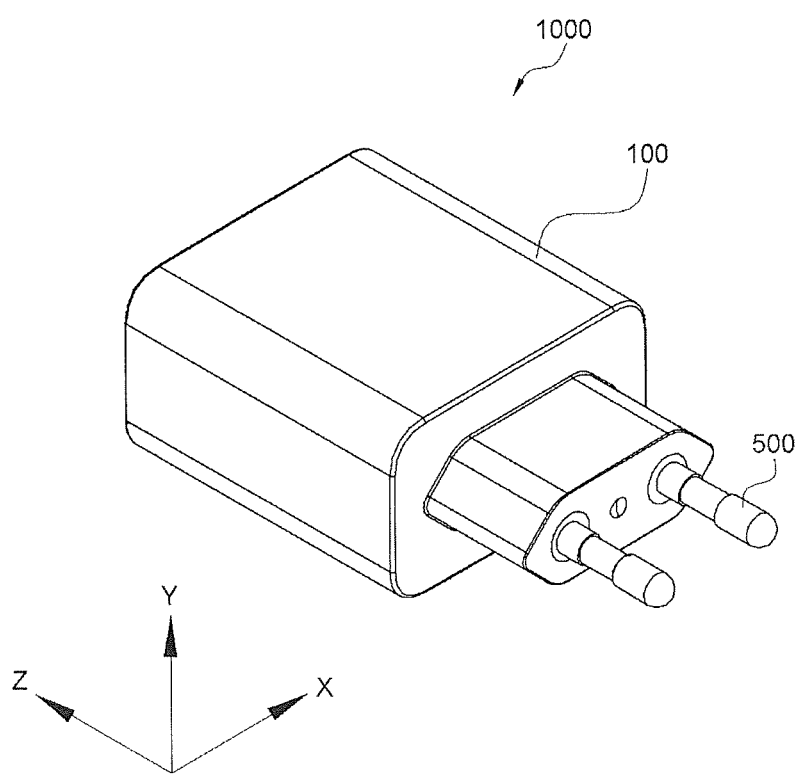
FIG. 1 is a perspective view of an electrical device according to an embodiment of the present invention.
Figure 2:
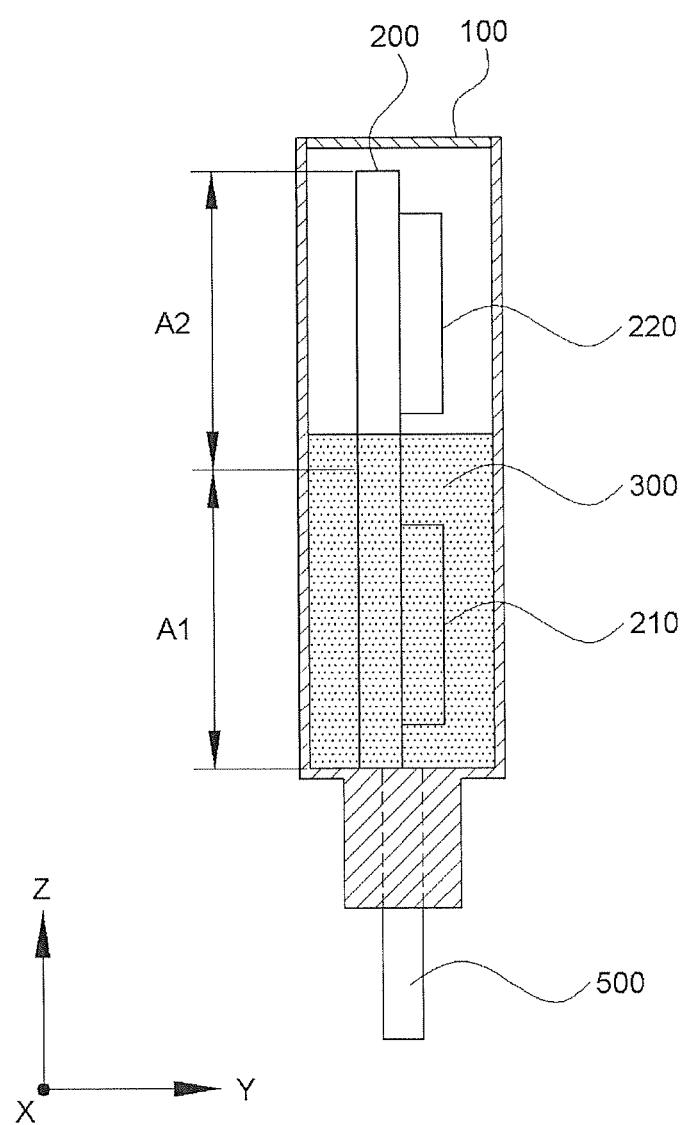
FIG. 2 is a schematic cross-sectional view of an electrical device according to a first embodiment of the present invention.

FIG. 1 illustrates an entire perspective view of an electrical device 1000 according to an embodiment of the present invention and FIG. 2 illustrates a schematic cross-sectional view of the electrical device 1000 according to a first embodiment of the present invention.

As illustrated below, it will be described by defining a direction in which the electrical device 1000 is coupled to an outlet as a Z direction, a direction perpendicular to the Z direction as an X direction, and a direction perpendicular to the Z direction and the X direction as the Y direction, and defining the Z direction as a length direction of the electrical device 1000, the X direction as a width direction, and the Y direction as a thickness direction. In addition, it will be described by defining a positive direction of a Z axis as an upper side and a negative direction of the Z axis as a lower side, and defining a positive direction of a Y axis as one side and a negative direction of the Y axis as the other side.

As illustrated, the electrical device 1000 includes a case 100, a PCB module 200, and a terminal pin 500. The case 100 has a shape of an enclosure having a space formed therein, and an upper side (a positive direction of the Z axis) is opened to accommodate the PCB module 200. In addition, the terminal pin 500 is coupled to a lower side (a negative direction of Z axis) of the case 100. Further, a cover 150 (see FIG. 7) may be coupled to an upper open surface of the case 100 so as to seal an internal space of the case 100.

Here, the case 100 may be formed of an insulating resin material, and may protect components accommodated therein from the outside. A plurality of insertion holes may be formed on the lower side of the case 100, and the terminal pin 500 may be inserted into the insertion holes to be fitted to the lower side of the case 100. The terminal pin 500 may be formed in the form of at least a pair of rods, in which an upper end thereof is inserted into the case 100 and is accommodated in the case 100 and is electrically connected to the PCB module 200, and a lower end thereof is exposed to the outside of the case 100. Here, the terminal pin 500 may be formed of a conductive metal material, and the lower end exposed to the outside of the case 100 is configured to be inserted into an outlet to receive external power and transmit the external power to the PCB module 200 through the upper end.

At this time, the electrical device 1000 of the present invention includes a filler 300 formed in an internal space in which the PCB module 200 is accommodated, and includes the following characteristic configurations in order to solve the above-described problems.

The filler 300 may be formed in a cured form by filling the internal space of the case 100 with a resin material made of an insulating resin material. The resin material may include silicon as a main raw material, and may additionally include silane treated aluminum hydroxide or quartz. The filler 300 serves to insulate between the components mounted on the PCB module 200, to firmly fix the PCB module 200 on the case 100, and to dissipate heat from the components mounted on the PCB module 200 through heat conduction by close contact with the PCB module 200 and the case 100 to cool the components. In particular, the filler 300 may be configured to receive heat from the components mounted on the PCB module 200 by being in close contact with the PCB module 200, and to discharge the received heat through the case 100 by being in close contact with an inner surface of the case 100.

Meanwhile, the electrical device 1000 of the present invention includes the following configuration to prevent low-temperature burns of the user by minimizing heat generation to the outside of the case 100 while securing a cooling performance of the PCB module 200.

The PCB module 200 may include a first region A1 in which a first component group 210 including components having a relatively high amount of heat generation is disposed, and a second region A2 in which a second component group 220 including components having a relatively low amount of heat generation is disposed. The first component group 210 may include, for example, a transformer or a semiconductor switch, and the second component group 220 may include a capacitor.

At this time, the filler 300 is filled in the internal space of the case 100, and a region of the filler 300 that is in contact with the first region A1 of the PCB module 200 may be greater than a region thereof that is in contact with the second region A2. Therefore, by increasing a heat dissipation efficiency of the first component group 210 disposed in the first region A1 and reducing a heat dissipation efficiency of the second component group 220, which has a relatively lower amount of heat generation than the first component group 210, through the filler 300, heat generated from the second component group 220 may be suppressed from being discharged through the case 100. In addition, a maximum allowable temperature of the second component group 220 may be configured to be higher than a maximum allowable temperature of the first component group 210. Therefore, the second component group 220 is configured to ensure durability during heat generation even if heat is not radiated through the filler 300.

As a specific example, the filler 300 may be configured to be in contact with at least a portion of the first region A1 and to be in non-contact with the second region A2. In addition, the filler 300 may preferably contact a region of 10% or more and 100% or less of the first region A1, and more preferably, contact a region of 20% or more and 90% or less of the first region A1. This is because when the contact region with the first region A1 is too narrow, the heat dissipation performance of the PCB module 200 may be deteriorated, and when the contact region is too wide, an external heat generation suppression effect of the case 100 is deteriorated. Additionally, the first region A1 is disposed at a lower side that is not touched by a user's hand on the case 100 and the second region A2 is disposed at an upper side that is touched by the user's hand on the case 100, such that a gripping portion on the case 100 may be prevented from low-temperature burn of the user by suppressing heat radiation due to the filler 300. Further, the filler 300 is configured so that the contact area with the inner surface of the case 100 is 30% or more and 90% or less of a total area of the case 100. As a result, the filler 300 may be configured to minimize heat generation of the gripping portion that is mainly touched by the user's hand rather than outside of the case 100 while maintaining the heat dissipation performance of the PCB module 200. In addition, the filler 300 may be configured to include an adhesive component, and may be in contact with one surface (a positive direction of a Y axis) or the other surface (a negative direction of the Y axis) or both surfaces of the first region A1 of the PCB module 200. This is to prevent gaps or spaces that may occur when the PCB module 200 and the filler 300 are spaced apart from each other as the PCB module 200 expands during heat generation and contracts during cooling. Further, a weight of the heaviest component among the first component group 210 may be heavier than a weight of the heaviest component among the second component group 220. This is to make the weight of the first region A1 relatively heavier than that of the second region A2 so as to impact the ground from the lower side of the electrical device having relatively high strength during a drop test.

Meanwhile, the filler 300 or the electrical device 1000 to which the filler 300 is applied may have one or more of the physical properties to be described later. Each physical property to be described later is independent, and one of the physical properties does not prioritize the other, and the filler 300 may satisfy at least one or two or more of the physical properties described below.

As an example, the filler 300 may be formed of a thermal conductive resin, and may have a thermal conductivity of about 0.5 W/mK or more, about 1.0 W/mK or more, about 1.5 W/mK or more, about 2 W/mK or more, 3 W/mK or more, or 4 W/mK or more. In addition, the thermal conductivity is 50 W/mK or less, 45 W/mk or less, 40 W/mk or less, 35 W/mk or less, 30 W/mk or less, 25 W/mk or less, 20 W/mk or less, 15 W/mk or less, 10 W/mK or less, 5 W/mK or less, 4.5 W/mK or less, or about 4.0 W/mK or less. The thermal conductivity of the filler 300 is a value measured according to, for example, ASTM D5470 standard or ISO 22007-2 standard. The method of setting the thermal conductivity of the filler 300 to the range as described above is not particularly limited. As an example, the thermal conductivity of the filler 300 may be adjusted through the type of resin used in the filler 300 and/or the use of a filler. For example, among the resin components known to be generally used as adhesives, acrylic-based resins, urethane-based resins, and silicone-based resins have similar heat conduction characteristics, epoxy-based resins are known to have excellent thermal conductivity compared to the above-mentioned resins, and olefin-based resins are known to have higher thermal conductivity than the epoxy-based resins. Therefore, it is possible to select a resin having excellent thermal conductivity among the resins, if necessary. However, in general, it is difficult to secure a desired thermal conductivity with only the resin component, and as described later, a method of including a filler component having excellent thermal conductivity in an appropriate ratio in the filler 300 may also be applied.

The filler 300 may be an electrically insulating filler. In the above-described structure, since the filler exhibits electrical insulation property, the performance of the PCB module may be maintained and stability thereof may be secured. An insulation breakdown voltage of the electrically insulating filler measured in accordance with ASTM D149 may be about 3 kV/mm or more, about 5 kV/mm or more, about 7 kV/mm or more, 10 kV/mm or more, 15 kV/mm or more, or 20 kV/rum or more. As a value of the insulation breakdown voltage increases, the filler exhibits excellent insulation property, and is not particularly limited, but may be about 50 kV/mm or less, 45 kV/mm or less, 40 kV/mm or less, 35 kV/mm or less, or 30 kV/mm or less, in consideration of the composition of the filler. The insulation breakdown voltage as described above may also be controlled by adjusting the insulation property of the resin component of the filler. For example, the insulation breakdown voltage may be adjusted by applying an insulating filler in the filler. In general, among the thermally conductive fillers, a ceramic filler as described later is known as a component capable of securing insulation property.

The filler 300 may have an appropriate adhesion in consideration of effective fixing of the PCB module 200, and impact resistance and vibration resistance in a process of using the module. In one example, the adhesion of the filler may be about 1,000 gf/10 mm or less, about 950 gf/10 mm or less, about 900 gf/10 mm or less, about 850 gf/10 mm or less, about 800 gf/10 mm or less, about 750 gf/10 mm or less, about 700 gf/10 mm or less, about 650 gf/10 mm or less, or about 600 gf/10 mm or less. In another example, the adhesion of the filler 300 may be about 50 gf/10 mm or more, about 60 gf/10 mm or more, about 70 gf/10 mm or more, or about 80 gf/10 mm or more. The adhesion may be a value measured by a peeling speed of about 300 ram/min and a peeling angle of 180 degrees. In addition, the adhesion may be adhesion to the case 100 with which the filler is in contact. Such adhesion may be secured, for example, by configuring the filler 300 with an adhesive layer. That is, the adhesion that a known adhesive material may exhibit is well known, and a material may be selected in consideration of such adhesion.

The filler 300 may have a specific gravity of 5 or less. In another example, the specific gravity may be 4.5 or less, 4 or less, 3.5 or less, or 3 or less. A filler having a specific gravity in such a range is advantageous for manufacturing a more weight-reduced electrical device 1000. As a value of the specific gravity is lower, it is advantageous for reducing the weight of the module. Therefore, a lower limit of the specific gravity is not particularly limited. For example, the specific gravity may be about 1.5 or more or 2 or more. Components added to the filler may be adjusted so that the filler exhibits the specific gravity in the range as described above. For example, a method of applying a filler that may secure the desired thermal conductivity even at as low a specific gravity as possible when adding the thermally conductive filler, that is, a filler having a low specific gravity by itself or applying a filler having a surface treatment may be used.

It may be advantageous that the filler 300 also exhibits an appropriate hardness. For example, if the hardness of the filler is too high, the filler may become too brittle, which may adversely affect reliability. In addition, impact resistance and vibration resistance may be secured and durability of a product may be secured by adjusting the hardness of the filler. The filler may, for example, has a hardness of less than 100, 99 or less, 98 or less, 95 or less, or 93 or less in a shore A type, and may have a hardness of less than 80, about 70 or less, about 65 or less, or about 60 or less in a shore D type. A lower limit of the hardness is not particularly limited. For example, the hardness may be 60 or more in the shore A type, or 5 or more or about 10 or more in the shore D type. The hardness of the filler is usually influenced by the type or ratio of fillers included in the filler, and when an excessive amount of filler is included, the hardness usually increases. However, as the silicone-based resins generally exhibit lower hardness than other resins such as epoxy or urethane, the resin component included in the filler also affects the hardness.

The filler 300 may also have a 5% weight loss temperature in the thermo gravimetric analysis (TGA) of 400° C. or higher, or a residual amount of 800° C. of 70% by weight or more. Due to these characteristics, stability of the PCB module 200 at a high temperature may be further improved. In another example, the residual amount of 800° C. may be about 75% by weight or more, about 80% by weight or more, about 85% by weight or more, or about 90% by weight or more. In another example, the residual amount of 800° C. may be about 99% by weight or less. The thermo gravimetric analysis (TGA) may be measured within the range of 25° C. to 800° C. at a temperature increase rate of 20° C./min in nitrogen ($N_2$) atmosphere of 60 cm$^3$/min. The result of the thermo gravimetric analysis (TGA) may also be achieved through the adjustment of the composition of the filler. For example, the residual amount of 800° C. is usually influenced by the type or ratio of fillers included in the filler, and when an excessive amount of filler is included, the residual amount increases. However, since silicone-based resins generally have higher heat resistance than other resins such as epoxy or urethane, the residual amount is higher, and the resin component included in the filler also affects hardness thereof.

The type of the filler 300 is not particularly limited as long as the PCB module 200 may be effectively fixed and the above-mentioned physical properties may be given as needed, and all known curable resin materials may be used. Examples of a material that may be used may include an acrylic-based resin, an epoxy-based resin, a urethane-based resin, an olefin-based resin, a urethane-based resin, an ethylene vinyl acetate (EVA)-based resin, or a silicone-based resin. Therefore, the filler may include the above-mentioned resins. The filler may include the resins as main components among the resin components. That is, an acrylic-based resin, an epoxy-based resin, a urethane-based resin, an olefin-based resin, a urethane-based resin, an ethylene vinyl acetate (EVA)-based resin, or a silicone-based resin among the total resin components included in the filler may be included in about 70% or more, about 75% or more, about 80% or more, about 85% or more, or about 90% or more based on weight. The ratio may be about 99% or less or about 95% or less.

The filler 300 may include a filler in consideration of the above-described thermal conductivity, insulation property, heat resistance (TGA analysis), or specific gravity. The thermal conductivity and the like in the above-described range may be secured through the use of an appropriate filler. In one example, the filler may be a thermally conductive filler. In the present application, the term thermally conductive filler refers to a material having a thermal conductivity of about 1 W/mK or more, about 5 W/mK or more, about 10 W/mK or more, or about 15 W/mK or more. The thermal conductivity of the thermally conductive filler may be about 400 W/mK or less, about 350 W/mK or less, or about 300 W/mK or less. The type of the thermally conductive filler that may be used is not particularly limited, but a ceramic filler may be applied in consideration of insulation property and the like. For example, ceramic particles such as alumina, aluminum nitride (AlN), boron nitride (BN), silicon nitride, SiC, ZnO, or BeO may be used. In addition, as long as the insulation property of the filler may be secured, an application of a carbon filler such as graphite may also be considered. The form or ratio of the filler included in the filler is not particularly limited, and may be selected in consideration of a viscosity of the resin composition, a possibility of sedimentation in the filler, desired thermal resistance or thermal conductivity, insulation property, a filling effect, or dispersibility. In general, as a size of the filler increases, the viscosity of the resin composition increases, and the possibility of the filler sedimentation in the filler increases. In addition, as the size of the filler decreases, the thermal resistance tends to increase. Therefore, in consideration of the above points, an appropriate type of filler may be selected, and if necessary, two or more types of filler may be used. In addition, considering a filling amount of the filler, it is advantageous to use a spherical filler, but in consideration of a formation of a network or conductivity, a filler in the form of a needle or plate may also be used. In one example, the filler may include a thermally conductive filler having an average particle diameter in the range of 0.001 µm to 80 µm. In another example, the average particle diameter of the filler may be 0.01 µm or more, 0.1 µm or more, 0.5 µm or more, 1 µm or more, 2 µm or more, 3 µm or more, 4 µm or more, 5 µm or more, or about 6 µm or more. In another example, the average particle diameter of the filler may be about 75 µm or less, about 70 µm or less, about 65 µm or less, about 60 µm or less, about 55 µm or less, about 50 µm or less, about 45 µm or less, about 40 µm or less, about 35 µm or less, about 30 µm or less, about 25 µm or less, about 20 µm or less, about 15 µm or less, about 10 µm or less, or about 5 µm or less.

The ratio of the filler included in the filler 300 may be selected in consideration of the characteristics of the filler so that the above-described characteristics, for example, thermal conductivity, insulation property, and the like may be secured. For example, the filler may be included within a range of about 50 to 2,000 parts by weight based on 100 parts by weight of the resin component of the filler. In another example, the weight part of the filler may be about 100 parts by weight or more, about 150 parts by weight or more, about 200 parts by weight or more, about 250 parts by weight or more, about 300 parts by weight or more, about 350 parts by weight or more, about 400 parts by weight or more, about 500 parts by weight or more, about 550 parts by weight or more, about 600 parts by weight or more, or about 650 parts by weight or more.

The filler 300 may further include a viscosity modifier to adjust the viscosity, if necessary, for example, to increase or decrease the viscosity or to adjust the viscosity according to a shearing force, for example, a thixotropy imparting agent, a diluent, a dispersant, a surface treatment agent, or a coupling agent.

The thixotropy imparting agent may effectively perform the manufacturing process of the electrical device by adjusting the viscosity according to the shearing force of the resin composition. Examples of the thixotropy imparting agent that may be used include fumed silica.

The diluent or the dispersant is usually used to lower the viscosity of the resin composition, and any of various types known in the art may be used without limitation as long as it may exhibit the above-described action.

The surface treatment agent is for surface treatment of the filler introduced into the filler, and any of various types known in the art may be used without limitation as long as it may exhibit the above-described action.

The coupling agent may be used, for example, to improve the dispersibility of the thermally conductive filler such as alumina, and any of various types known in the art may be used without limitation as long as it may exhibit the above-described action.

Second Embodiment

Figure 3:
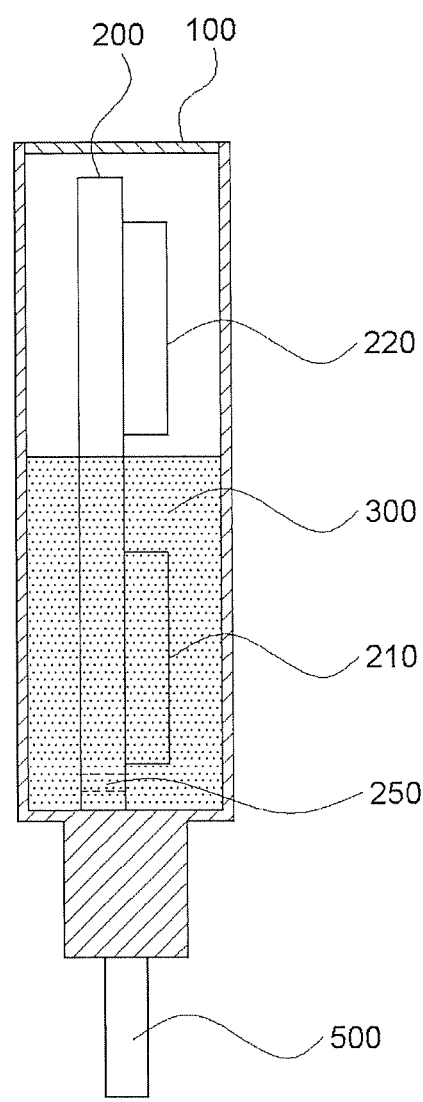
FIG. 3 is a schematic cross-sectional view of an electrical device according to a second embodiment of the present invention.

FIG. 3 illustrates a schematic cross-sectional view of the electrical device 1000 according to a second embodiment of the present invention.

As illustrated, the electrical device 1000 includes a case 100, a PCB module 200 including the first region A1 (see FIG. 2) in which the first component group 210 is disposed and the second region A2 (see FIG. 2) in which the second component group 220 is disposed, a filler 300, and a terminal pin 500. Since the electrical device 1000 according to the present embodiment has a similar configuration and coupling structure to the electrical device 1000 of the first embodiment described above, only differences will be described in detail below.

The PCB module 200 according to the present embodiment may have a single or a plurality of through holes 250 that penetrate through the PCB module 200 from one surface (hereinafter, referred to as one surface) of the PCB module 200 in a thickness direction to the other surface (hereinafter, referred to as the other surface) in the thickness direction to allow a resin material of the filler 300 to flow. The resin material injected into the case 100 through the through hole 250 may be quickly and evenly filled on one surface and the other surface of the PCB module 200. The through hole 250 may be formed to correspond to a position where the filler 300 is formed, and preferably may be formed in the first region A1 of the PCB module 200. More preferably, the through hole 250 may be formed at a lower side than the first component group 210 provided in the first region A1. When the injection of the resin material is delayed or a space is formed at the lower side of the first component group 210 due to the first component group 210, the resin material introduced to the side opposite to the side on which the first component group 210 is mounted may be introduced into a lower portion of the side on which the first component group 210 is mounted through the through hole 250.

Third and Fourth Embodiments

Figure 4:
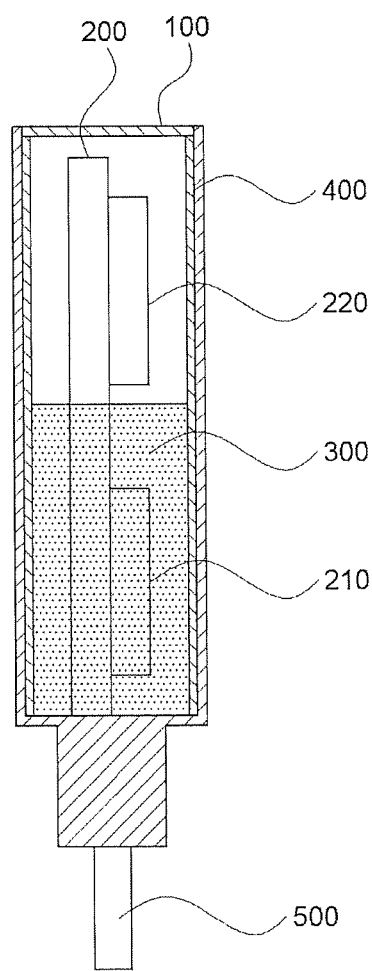
FIG. 4 is a schematic cross-sectional view of an electrical device according to a third embodiment of the present invention.
Figure 5:
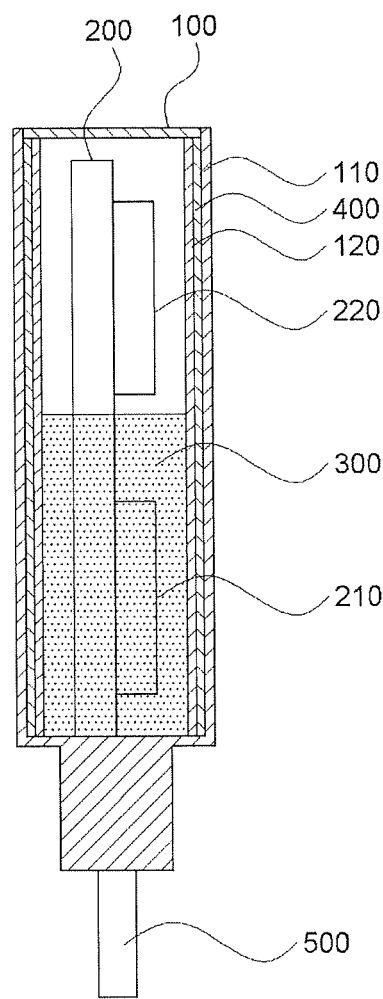
FIG. 5 is a schematic cross-sectional view of an electrical device according to a fourth embodiment of the present invention.

FIG. 4 illustrates a schematic cross-sectional view of the electrical device 1000 according to a third embodiment of the present invention and FIG. 5 illustrates a schematic cross-sectional view of the electrical device 1000 according to a fourth embodiment of the present invention.

As illustrated, the electrical device 1000 includes a case 100, a PCB module 200 including the first region A1 (see FIG. 2) in which the first component group 210 is disposed and the second region A2 (see FIG. 2) in which the second component group 220 is disposed, a filler 300, and a terminal pin 500. Since the electrical device 1000 according to the present embodiment has a similar configuration and coupling structure to the electrical device 1000 of the first embodiment described above, only differences will be described in detail below.

The electrical device 1000 according to the present embodiment may further include a heat transfer reinforcing member 400 to more effectively disperse heat of the filler 300 transferred from the PCB module 200. The heat transfer reinforcing member 400 may be, for example, a panel made of a metal material or a thermal pad. The heat transfer reinforcing member 400 may be provided between the inner surface of the case 100 and the filler 300 as in the third embodiment illustrated in FIG. 4, and as in the fourth embodiment illustrated in FIG. 5, the case 100 may have an outer case 110 and an inner case 120 and the heat transfer reinforcing member 400 may be provided between the outer case 110 and the inner case 120. The heat transfer reinforcing member 400 may be configured to reduce an external temperature of the case by dissipating the heat from the filler 300 to radiate the heat while suppressing heat transferred to the outside of the case 100 or to the outer case 110.

The heat transfer reinforcing member 400 is provided to further maximize the heat dissipation effect when the filler 300 contacts between 10 to 50% of the first region A1.

Fifth Embodiment

Figure 6:
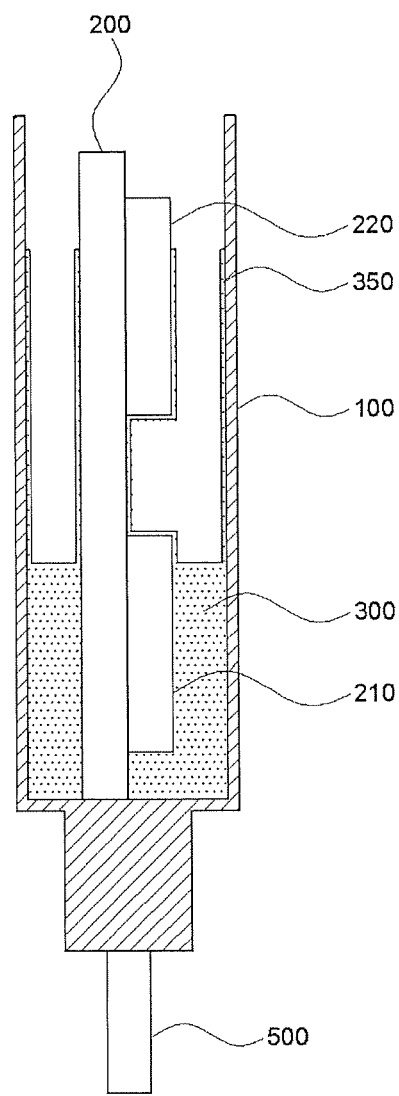
FIG. 6 is a schematic cross-sectional view of an electrical device according to a fifth embodiment of the present invention.

FIG. 6 illustrates a schematic cross-sectional view of the electrical device 1000 according to a fifth embodiment of the present invention.

As illustrated, the electrical device 1000 includes a case 100, a PCB module 200 including the first region A1 (see FIG. 2) in which the first component group 210 is disposed and the second region A2 (see FIG. 2) in which the second component group 220 is disposed, a filler 300, and a terminal pin 500. Since the electrical device 1000 according to the present embodiment has a similar configuration and coupling structure to the electrical device 1000 of the first embodiment described above, only differences will be described in detail below.

The filler 300 further includes a coating region 350 in which a resin material is applied to the inner surface of the case 100 or the PCB module 200 with a predetermined thickness. The coating region 350 may be formed at an upper side than a filling height of the filler 300, and the heat transferred to the outside of the case 100 may be minimized or a heat dissipation temperature may be lowered while dispersing and dissipating the heat of the filler 300 through the coating region 350. There is an advantage of simplifying the manufacturing process and lowering the manufacturing cost while expecting the same effect as the heat transfer reinforcing member 400 of the third and fourth embodiments described above through the coating region 350.

Hereinafter, a manufacturing method of an electrical device of the present invention configured as described above will be described with reference to the accompanying drawings.

Figure 7C:
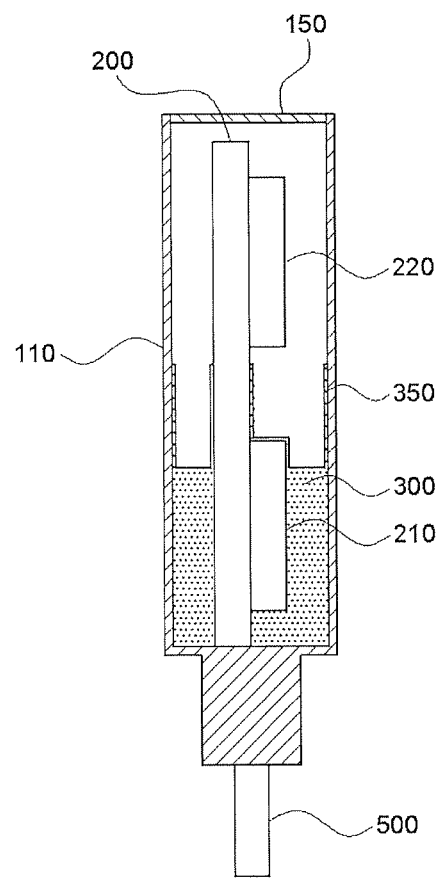

FIG. 7A to 7C illustrates a schematic cross-sectional view illustrating a manufacturing method of an electrical device according to the first embodiment of the present invention.

First, as illustrated in FIG. 7A, a step of accommodating the PCB module 200 in the body 110 of the case 100 having an opened upper portion and forming an internal space is performed. The PCB module 200 is divided into a first region on which the first component group 210 is mounted and a second region on which the second component group 220 is mounted, and may be accommodated so that the first region is located at the lower side. In addition, when the PCB module 200 is accommodated, a lower end of the PCB module 200 may be electrically connected to the terminal pin 500.

Next, as illustrated in FIG. 7B, a step of forming the filler 300 by injecting the resin material into the body 110 in which the PCB module 200 is accommodated is performed. The filler 300 may be formed to be in contact with the first region and non-contact with the second region, and a specific embodiment may follow the above-described embodiment.

Next, as illustrated in FIG. 7C, a step of forming a coating region 350 at an upper side than the filling height of the filler 300 by recovering a portion of the resin material is performed. At this time, if the resin material is injected and immediately recovered, a thickness of the coating region 350 may be too thin or the coating region 350 may not be formed. Therefore, it is preferable to recover the resin material after a certain time elapses, however, before the resin material is cured. After the coating region 350 is formed, a cover 150 is coupled to the upper opening portion of the body 110 to seal the internal space of the body 110.

Figure 8A:
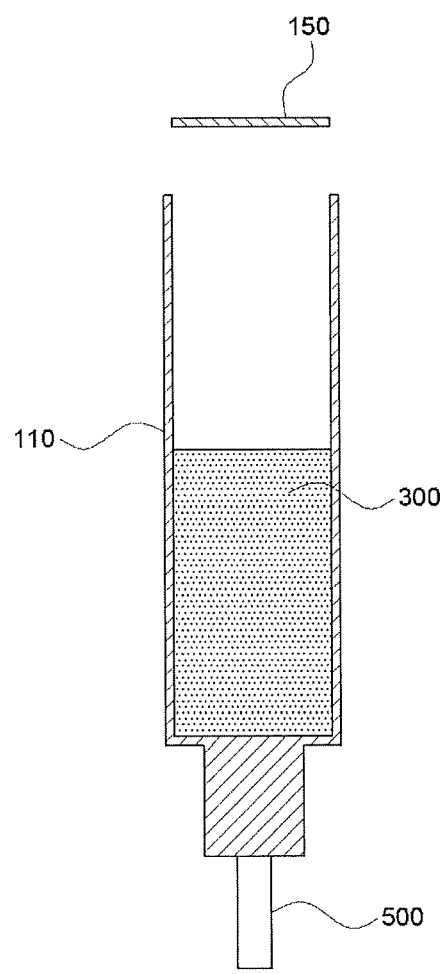
Figure 8C:
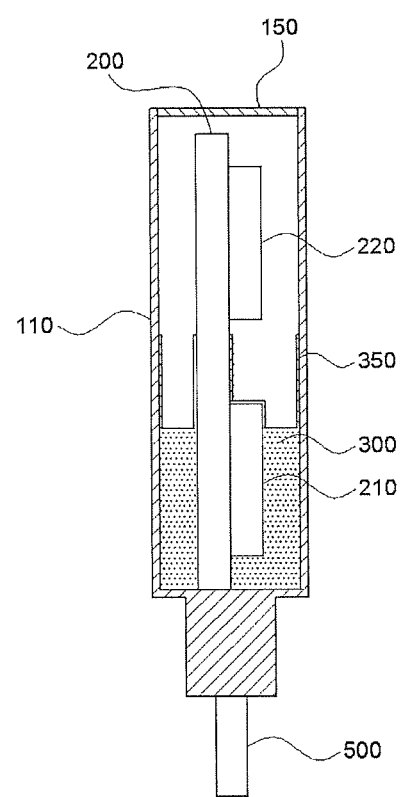

FIG. 8A to 8C illustrates a schematic cross-sectional view illustrating a manufacturing method of an electrical device according to the second embodiment of the present invention.

First, as illustrated in FIG. 8A, a step of forming the filler 300 by injecting a resin material into the body 110 of the case 100 having an opened upper portion and forming an internal space is performed.

Next, as illustrated in FIG. 8B, a step of accommodating the PCB module 200 in the body 110 in which the filler 300 is formed is performed. The PCB module 200 is divided into a first region on which the first component group 210 is mounted and a second region on which the second component group 220 is mounted, and may be accommodated so that the first region is located at the lower side. In addition, when the PCB module 200 is accommodated, a lower end of the PCB module 200 may be electrically connected to the terminal pin 500. At this time, the filler 300 may be formed to be in contact with the first region and non-contact with the second region, and a specific embodiment may follow the above-described embodiment.

Next, as illustrated in FIG. 8C, a step of forming a coating region 350 at an upper side than the filling height of the filler 300 by recovering a portion of the resin material is performed. At this time, if the resin material is injected and immediately recovered, a thickness of the coating region 350 may be too thin or the coating region 350 may not be formed. Therefore, it is preferable to recover the resin material after a certain time elapses, however, before the resin material is completely cured. After the coating region 350 is formed, a cover 150 is coupled to the upper opening portion of the body 110 to seal the internal space of the body 110.

FIGS. 9A to 9E illustrate schematic cross-sectional views illustrating a manufacturing method of an electrical device according to the third embodiment of the present invention.

Figure 9A:
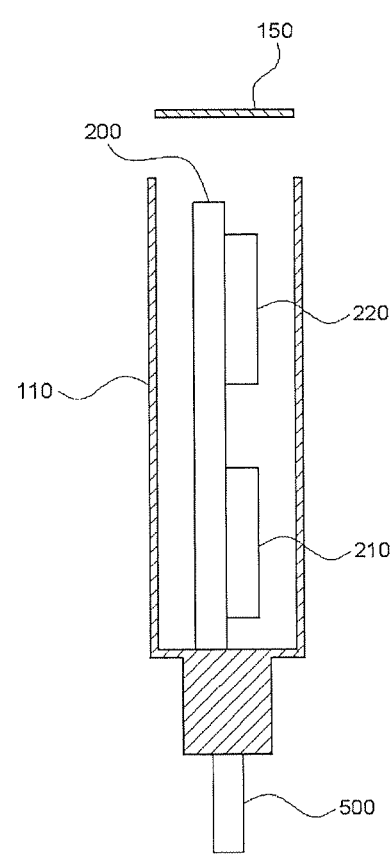

First, as illustrated in FIG. 9A, a step of accommodating the PCB module 200 in the body 110 of the case 100 having an opened upper portion and forming an internal space is performed. The PCB module 200 is divided into a first region on which the first component group 210 is mounted and a second region on which the second component group 220 is mounted, and may be accommodated so that the first region is located at the lower side. In addition, when the PCB module 200 is accommodated, a lower end of the PCB module 200 may be electrically connected to the terminal pin 500.

Figure 9B:
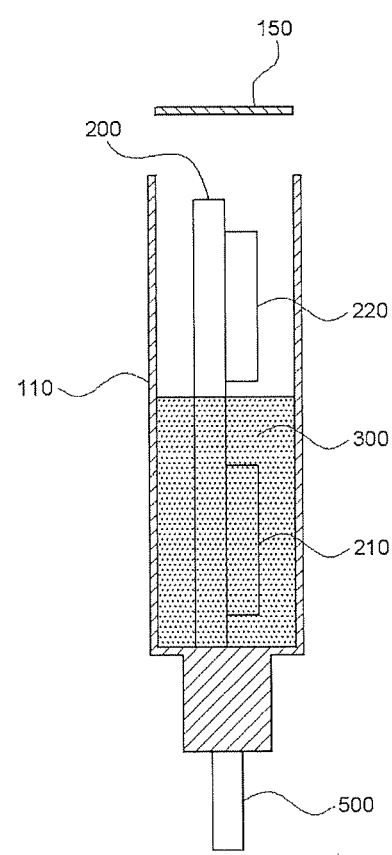

Next, as illustrated in FIG. 9B, a step of forming the filler 300 by injecting the resin material into the body 110 in which the PCB module 200 is accommodated is performed. The filler 300 may be formed to be in contact with the first region and non-contact with the second region, and a specific embodiment may follow the above-described embodiment.

In this embodiment, a configuration in which the PCB module 200 is pre-accommodated in the case 100 and then filled with the resin material is described, but as in the second embodiment described above, the case 100 may be pre-filled with the resin material, and may then accommodate the PCB module 200.

Figure 9D:
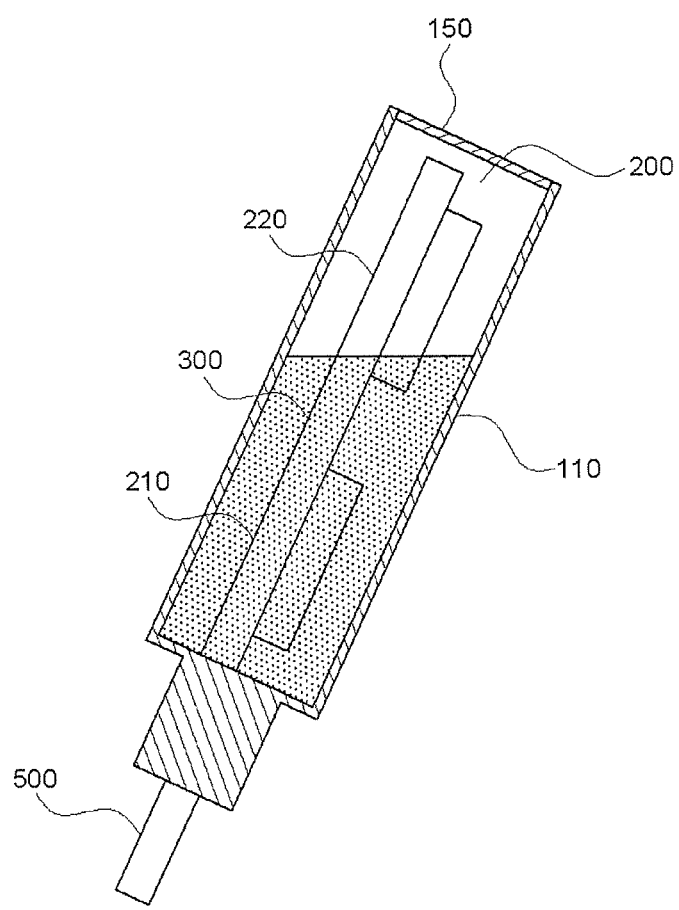

Next, as illustrated in FIGS. 9C and 9D, a step of forming a coating region 350 in which the resin material is coated with a predetermined thickness at an upper side than the filling height of the filler 300 by tilting the case 100 filled with the resin material to one side or the other side in the Y direction is performed. At this time, in order to prevent the thickness of the coating region 350 from being too thin or the coating region 350 from being not formed, it is preferable to perform the step of forming the coating region 350 by changing an inclination to an original assembly position perpendicular to a bottom surface or the other side after a certain time elapses after tilting the case 100, but before the resin material is cured.

Figure 9E:
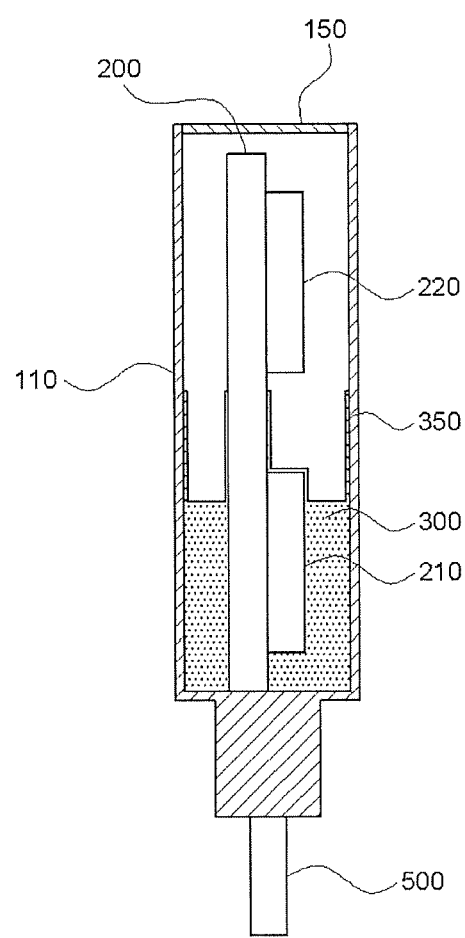

Next, as illustrated in FIG. 9E, after the coating region 350 is formed, a cover 150 is coupled to the upper opening portion of the body 110 to seal the internal space of the body 110.

The electrical device of the present invention having the configuration as described above may prevent heat from being concentrated on a specific component, and prevent damage or shortening of the lifespan of the component by heat by dispersing heat through the filler, thereby improving durability.

Further, the heat of the components is eventually radiated through the case, and therefore, if the heat transfer efficiency is improved, there is a problem that the user may get a low-temperature burn or feel discomfort due to high temperature when the user directly touches the case of an electrical device. Therefore, according to the present invention, by forming the filler only in the region (the lower portion of the case) which is not the region (the upper portion of the case) mainly gripped by the user, as the heat shielding performance of the region (the upper portion of the case) gripped by the user is improved, it is possible to prevent the low-temperature burn of the user while improving heat dissipation performance.

Further, since the filler contains the adhesive component, the adhesion of the filler may be maintained even when the PCB module is expanded or contracted, thereby improving the heat dissipation efficiency of the PCB module due to heat conduction.

Further, as the filler is filled only in a portion of the case, the weight of the electrical device may be reduced.

Further, the weight of the electrical device may be reduced while improving the heat dissipation efficiency through the coating region of the filler.

Further, since the filler supports the PCB module, it is not necessary to provide the separate support means, so that the electrical device may be made lighter and smaller.

The present invention is not to be construed as being limited to the above-mentioned embodiment. The present invention may be applied to various fields and may be variously modified by those skilled in the art without departing from the scope of the present invention claimed in the claims. Therefore, these improvements and changes will fall within the scope of protection of the present invention as long as it is apparent to those skilled in the art.

DETAILED DESCRIPTION OF MAIN ELEMENTS

1000: electrical device
100: case
110: outer case
120: inner case
150: cover
200: PCB module
210: first component group
220: second component group
250: through hole
300: filler
350: coating region
400: heat transfer reinforcing member
500: terminal pin
A1: first region
A2: second region

What is claimed is:

1. An electrical device comprising:
a case including a lower portion and a-side walls, and having a space formed therein;
a printed circuit board (PCB) module accommodated in an internal space of the case and including a plurality of components and a PCB on which the plurality of components are mounted;
a filler existing in the internal space of the case and made of a resin material; and
a terminal pin disposed on an outer surface of the lower portion of the case,
wherein the PCB module includes a first region including a first component group, and a second region including a second component group, wherein heat generated by the second component group is less than heat generated by the first component group,
the first region and the second region of the PCB module are located in the internal space of the case,
the filler is disposed on the lower portion of the case where the first component group is located between the side walls of the case to cover one surface and another surface of the PCB in the first region of the PCB module, and the one surface and the another surface of the PCB in the first region of the PCB module are parallel to at least one of the side walls of the case and are opposite to each other, and
the filler is not disposed on the one surface and the another surface of the PCB in the second region of the PCB module.

2. The electrical device of claim 1, wherein the filler is not in contact with the second region and in contact with at least a portion of the first region.

3. The electrical device of claim 2, wherein the filler is in contact with a region of 10% or more to 100% or less of the first region.

4. The electrical device of claim 2, wherein the filler is in contact with a region of 20% or more to 90% or less of the first region.

5. The electrical device of claim 1, wherein the filler has a contact area with an inner surface of the case of 30% or more to 90% or less of a total area of the case.

6. The electrical device of claim 1, wherein the filler includes an adhesive component, and is in contact with the first region of the PCB.

7. The electrical device of claim 1, wherein the PCB includes at least one through hole in the first region so that the resin material forming the filler flows between one surface and the other surface of the PCB in a fluid state before being cured.

8. The electrical device of claim 7, wherein the PCB module is accommodated in the case in a length direction (Z axis direction) of the PCB module, the first region is formed to be closer to a lower side (a negative direction of a Z axis) of the PCB module compared to the second region, and the through hole is formed to be closer to the lower side (the negative direction of the Z axis) of the PCB module compared to the first component group included in the first region.

9. The electrical device of claim 1, wherein a maximum temperature allowable by material of the second component group is higher than a maximum temperature allowable by material of the first component group.

10. The electrical device of claim 1, wherein the first component group includes at least one of a transformer and a semiconductor switch, and the second component group includes a capacitor.

11. The electrical device of claim 1, wherein a heat transfer reinforcing member is provided between at least a portion of the first component group that is not directly in contact with the filler and the filler.

12. The electrical device of claim 11, wherein the heat transfer reinforcing member is a metal material or a thermal pad.

13. The electrical device of claim 1, wherein the filler has a thermal conductivity of 0.6 W/mk or more.

14. The electrical device of claim 1, wherein the filler has an adhesion of 50 gf/10 mm or more to 1,000 gf/10 mm or less.

15. The electrical device of claim 1, wherein the filler has a specific gravity of 3 or less.

16. The electrical device of claim 1, wherein the filler includes an acrylic resin, an epoxy resin, a urethane resin, an olefin resin, an EVA resin, or a silicone resin.

17. The electrical device of claim 1, wherein the filler further includes a coating region coated with the resin material with a predetermined thickness on the case or the PCB module.

18. The electrical device of claim 17, wherein the coating region is formed at an upper side a filling height of the filler.

19. The electrical device of claim 1, wherein a weight of the heaviest component in the first component group is heavier than a weight of the heaviest component in the second component group.

20. The electrical device of claim 1, wherein the filler covers the first component group comprising at least one of a transformer and a semiconductor switch, disposed closer to the terminal pin than the second component group, and the filler does not cover the second component group including a capacitor.

* * * * *